(12) United States Patent
Kollias et al.

(10) Patent No.: US 11,193,844 B2
(45) Date of Patent: Dec. 7, 2021

(54) SENSOR WITH MULTIPLE MODES OR RANGES

(71) Applicant: Infineon Technologies AG, Neubiberg (DE)

(72) Inventors: Athanasios Kollias, Munich (DE); Christian Jenkner, Klagenfurt (AT); Alexander Joebstl, Villach (AT); Daniel Neumaier, Feldkirchen (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 311 days.

(21) Appl. No.: 16/418,213

(22) Filed: May 21, 2019

(65) Prior Publication Data

US 2019/0383684 A1 Dec. 19, 2019

(30) Foreign Application Priority Data

Jun. 13, 2018 (EP) .................................... 18177564

(51) Int. Cl.
*G01L 9/02* (2006.01)
*G01L 9/12* (2006.01)
*G01L 27/00* (2006.01)

(52) U.S. Cl.
CPC .................. *G01L 9/02* (2013.01); *G01L 9/12* (2013.01); *G01L 27/005* (2013.01)

(58) Field of Classification Search
CPC ..... G01L 19/147; G01L 9/0042; G01L 19/04; G01L 9/0054; G01L 9/0072; G01L 13/025; G01L 19/14; G01L 19/038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143; G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672;

(Continued)

(56) References Cited

U.S. PATENT DOCUMENTS

2010/0180687 A1 7/2010 Hammerschmidt
2016/0047852 A1* 2/2016 Poisson .................. G01R 31/52
324/522

(Continued)

FOREIGN PATENT DOCUMENTS

WO 9324818 A2 12/1993
WO 9857188 A1 12/1998

*Primary Examiner* — Andre J Allen
(74) *Attorney, Agent, or Firm* — Slater Matsil, LLP

(57) ABSTRACT

In accordance with an embodiment, a sensor includes: a signal source with a first signal source terminal and a second signal source terminal; a bridge circuit connected to the first and second signal source terminals, the bridge circuit including: a first branch including: a first reference impedance element; and a first sensor impedance element configured to transduce a magnitude to be measured into a first impedance-related parameter; and a second branch including: a second reference impedance element; and a second sensor impedance element configured to transduce the magnitude to be measured into a second sensor impedance-related parameter.

20 Claims, 11 Drawing Sheets

(58) Field of Classification Search
CPC ... G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10; G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16
USPC ............................................. 73/700–756
See application file for complete search history.

(56) References Cited

U.S. PATENT DOCUMENTS

2018/0087985 A1* 3/2018 Chang ...................... G06F 1/26
2019/0339144 A1* 11/2019 Smerzi ................ G01L 9/0052

* cited by examiner

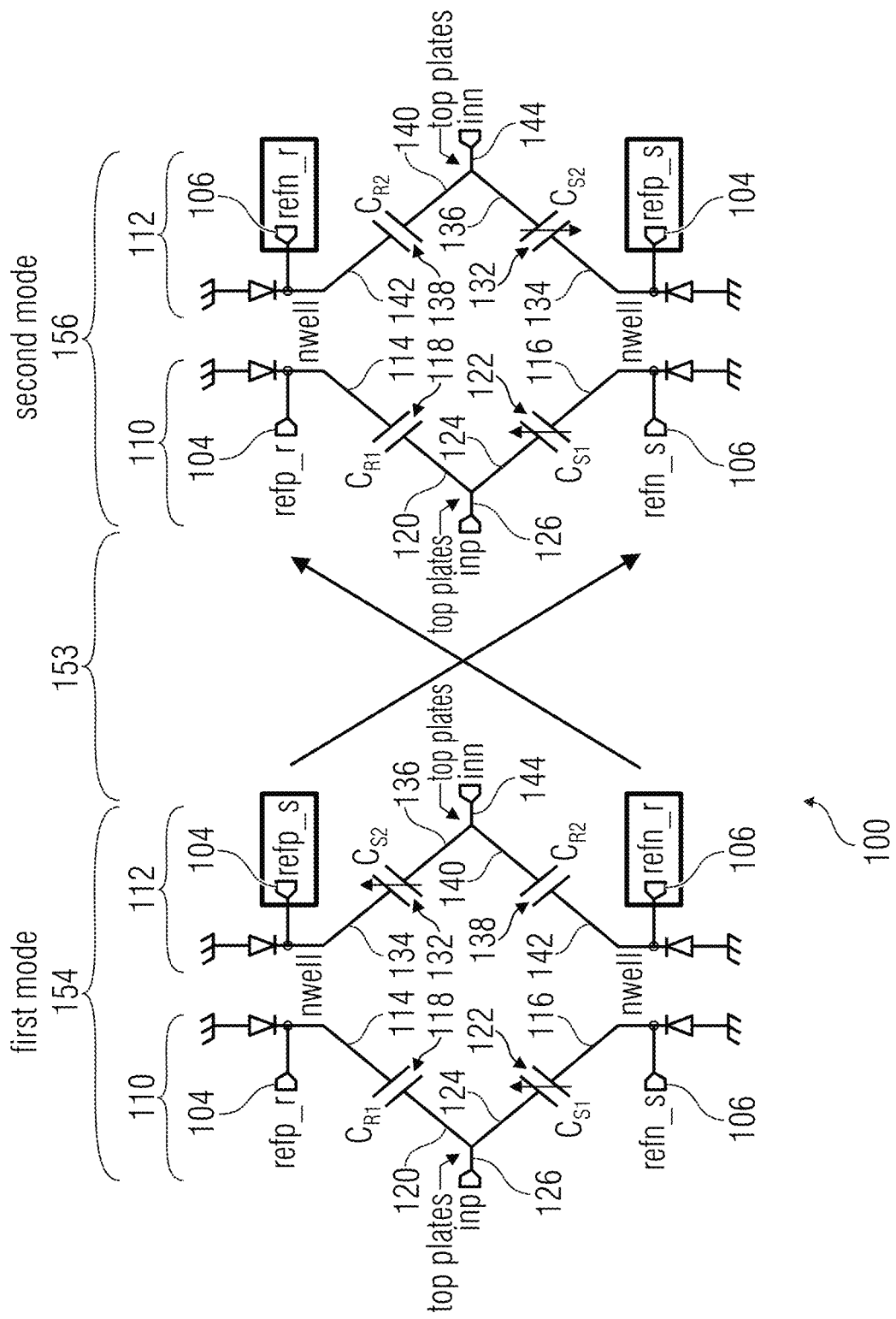

SENSOR WITH MULTIPLE MODES OR RANGES

This application claims the benefit of European Patent Application No. 18177564.4, filed on Jun. 13, 2018, which application is hereby incorporated herein by reference in its entirety.

TECHNICAL FIELD

Examples relate to the field of sensors, such as environmental sensors and pressure sensors.

BACKGROUND

Capacitive or impedance-based sensors are known. For example, a sensor capacitance element may be such that a value to be measured (such as pressure) modifies the capacitance of a capacitor. The capacitance (or an electric signal associated to the capacitance) may be measured, so as to obtain an electric value associated to the pressure or, more in general, the value to be measured.

Bridge-based sensors are also known, comprising both capacitors of known and non-variable capacitance and sensor capacitance elements. Even in this case, an output signal may be associated to the pressure or, more in general, to a value to be measured.

In several applications, there arises the necessity of performing measurements in different ranges in different situations. For example, barometric pressures may be measured when the sensor is in air, while higher pressures shall be measured when the same sensor is in water or is used for bicycle tire monitoring.

However, it is in general difficult to have one single sensor which measures pressure or other physical values at so different ranges. Some sensors are manufactured so that in one single chip two different sensors coexist, e.g., one for a first range and one for a second range. Hence, two bridge circuits are necessary in the same chip.

SUMMARY

A sensor (such as an environmental sensor or a pressure sensor) is provided which comprises a circuitry configured to provide a measured value of a magnitude to be measured according to: sensor comprising a circuitry of a magnitude to be measured according to: a normal range; and an extended range, the sensor further comprising selection elements configured to switch between: a first mode for acquiring the measured value in the normal range; and a second mode for acquiring the measured value in the extended range.

A sensor (such as an environmental sensor or a pressure sensor) may comprise: a signal source with a first signal source terminal and a second signal source terminal; a bridge circuit connected to the first and second signal source terminals, the bridge circuit including: a first branch including: a first reference impedance element; and a first sensor impedance element configured to transduce a magnitude to be measured into a first impedance-related parameter; a second branch including: a second reference impedance element; and a second sensor impedance element configured to transduce the magnitude to be measured into a second sensor impedance-related parameter; a first output terminal intermediate between the first reference impedance element and the first sensor impedance element; and a second output terminal intermediate between the second reference impedance element and the second sensor impedance element; selection elements configured to switch between a first mode and a second mode, wherein in the second mode the second branch is inverted with respect to the first mode; and a circuitry configured to provide a measured value on the basis of a differential signal obtained between the first output terminal and the second output terminal.

Accordingly, with one single bridge circuit it is possible to have measurements in two different ranges, hence reducing space in the chip.

BRIEF DESCRIPTION OF THE DRAWINGS

FIG. 1c is a schema of a sensor.

DETAILED DESCRIPTION OF ILLUSTRATIVE EMBODIMENTS

Hereinafter, reference is explicitly made to pressure sensors and environmental sensors. However, the same technique may be implemented for other physical magnitudes. In many examples, any physical magnitude which is capable of modifying an impedance or resistance may be measured.

Figure 1A:
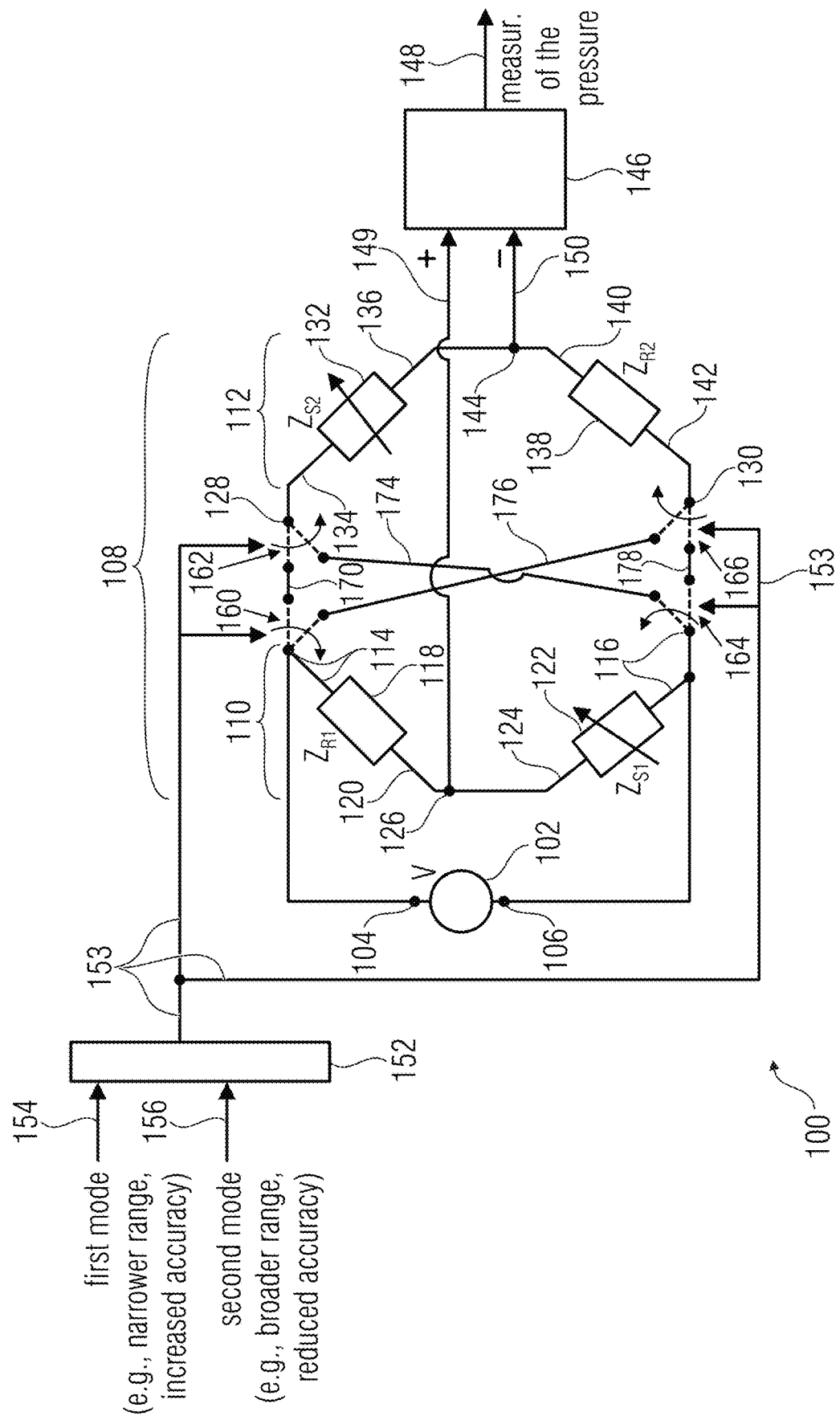
FIGS. 1a and 1b show examples of sensors.
Figure 1B:
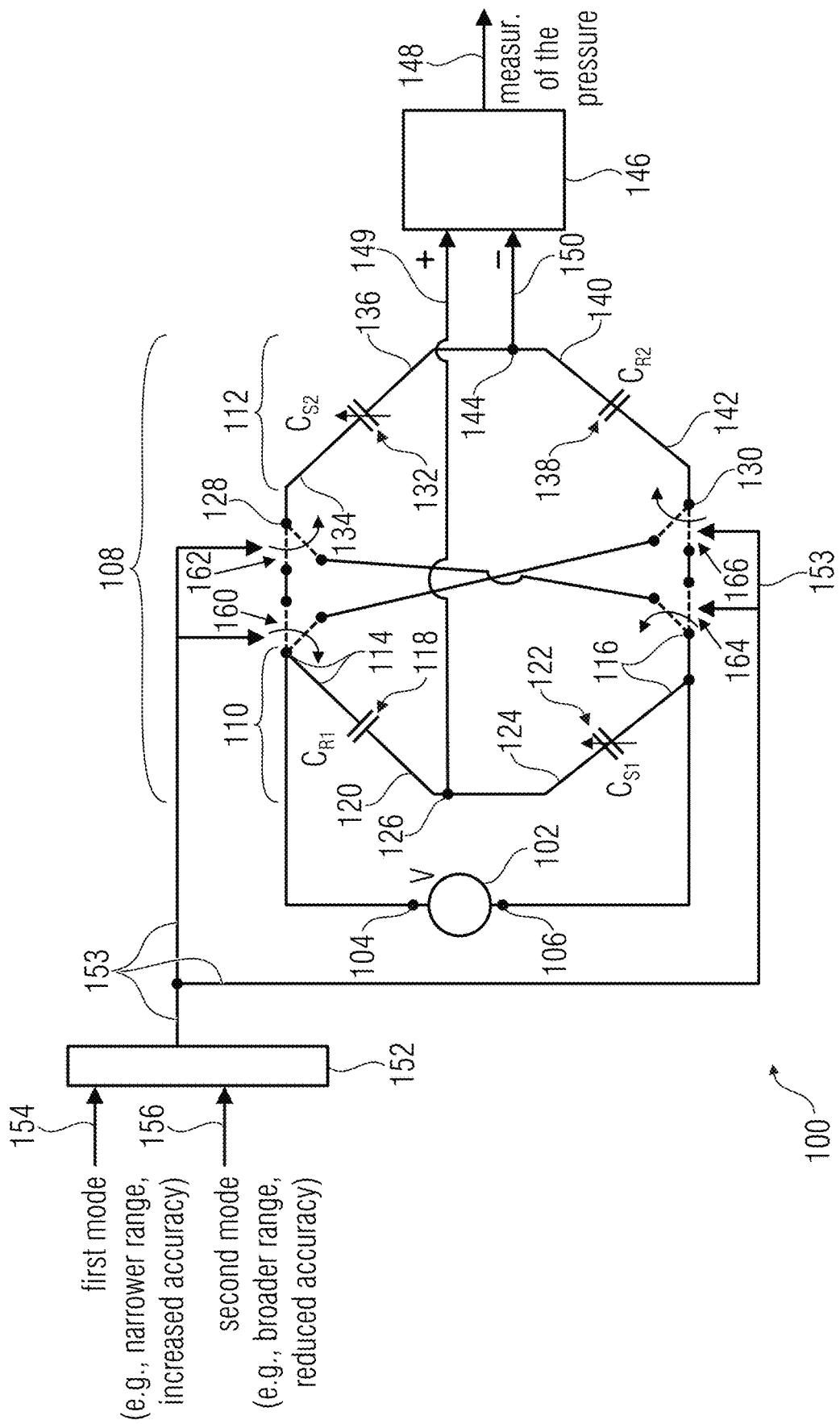

Examples of sensors (e.g., environmental sensors, pressure sensors), referred to with numeral 100, are provided in FIGS. 1a-1c, FIGS. 1a and 1b. The difference between these figures is in that the impedance elements of FIG. 1a are replaced by capacitance elements (capacitors) in FIG. 1b. In some cases FIGS. 1a and 1b refer to the same embodiment (each impedance being associated to a related capacitance). In some other cases, FIGS. 1a and 1b refer to the different embodiments: for example, the impedance elements of FIG. 1a may be resistors. FIG. 1c may be another representation of FIG. 1b, in which different configurations (modes) are depicted.

An environmental sensor 100 may comprise, for example, electric elements (such as impedance elements, capacitors, resistors, etc.) which are transducers that modify their electric parameter(s) on the basis of the pressure. In some elements, an increased pressure causes an increased capacitance (capacitance sensor elements), while in other elements an increased pressure causes an increased resistance (resistor sensor elements), e.g., in accordance to the particular resistor material and the particular implementation. The modification of the electric parameters may modify electric magnitudes or signals (currents, voltages), which may be measured and used to calculate a digital output which provides a digital measurement of a pressure.

An environmental sensor 100 may comprise a signal source 102 with a first signal source terminal 104 and a second signal source terminal 106. In examples (e.g., where the impedance elements are capacitors or resistors), the signal source 102 may be an AC signal source, wherein the signal (voltage or current) changes over time, e.g., periodically. For example, the signal at the terminals 104 and 106 may be sinusoidal. Otherwise, the signal may be a square wave signal. For example, during a particular semi period the voltage potential may be +V at the terminal 104 and −V at the terminal 106, while during a preceding and/or subsequent semi period the voltage potential may be −V at the terminal 104 and +V at the terminal 106. In examples, (e.g., where the impedance elements are resistors) the signal may be a DC voltage.

The environmental sensor 100 may comprise a bridge circuit 108, which may have a first branch 110 and a second branch 112. Both the first and second branches 110 and 112 may be supplied by the signal source 102. In examples, the first and second branches 110 and 112 may be connected in parallel to each other.

The first branch 110 may comprise a first reference impedance element 118 with impedance $Z_{R1}$. The first reference impedance element 118 may be a first reference capacitance element with capacitance $C_{R1}$ (and $Z_{R1}=1/2\pi f C_{R1}$, f being the frequency of the signal generated by the signal source 102). In other examples, the first reference impedance element 118 may be a first reference resistor $R_{R1}$ (and $Z_{R1}=R_{R1}$).

The first branch 110 may comprise a first sensor impedance element 122 with first variable impedance $Z_{S1}$. The first sensor impedance element 122 may be a first sensor capacitance element with first variable capacitance $C_{S1}$ (and $Z_{S1}=1/2\pi f C_{R1}$). In other examples, the first sensor impedance element 118 may be a first sensor resistor $R_{S1}$ (and $Z_{S1}=R_{S1}$).

The first reference impedance element 118 may be connected in series to the first sensor impedance element 122. For example: a first terminal 114 of the first reference impedance element 118 may be connected to the first signal source terminal 104; and/or a second terminal 120 of the first reference impedance element 118 may be connected to a first terminal 124 of the first sensor impedance element 122; and/or a second terminal 116 of the first sensor impedance element 122 may be connected to the second signal source terminal 106.

Basically, the terminals 114 and 116 form an input port input by a signal generated by the signal source 102. The terminals 114 and 116 may be understood as a supply port which supplies the electric elements of the first branch 110.

The second branch 112 may comprise a second reference impedance element 138 with impedance $Z_{R2}$. The second reference impedance element 138 may be a second reference capacitance element with capacitance $C_{R2}$ (and $Z_{R2}=1/2\pi f C_{R2}$). In other examples, the second reference impedance element 138 may be a second reference resistor $R_{R2}$ (and $Z_{R2}=R_{R2}$).

The second branch 112 may comprise an input port formed by the terminals 128 and 130. The second branch 112 may comprise a second sensor impedance element 132 with second variable impedance $Z_{S2}$. The second sensor impedance element 132 may be a second sensor capacitance element with second variable capacitance $C_{S2}$ (and $Z_{S2}=1/2\pi f C_{S2}$). In other examples, the second sensor impedance element 132 may be a second sensor resistor $R_{S2}$ (and $Z_{S2}=R_{S2}$).

The second branch 112 may provide a series connection between the second reference impedance element 138 and the second sensor impedance element 132. For example: a first terminal 134 of the second sensor impedance element 132 (corresponding to the first terminal 128 of the second branch 112) is connected to one of the first signal source terminal 104 and second signal source terminal 106; and/or a second terminal 136 of the second sensor impedance element 132 (corresponding to the second terminal 130 of the second branch 112) may be connected to a first terminal 140 of the second reference impedance element 138; and/or a second terminal 142 of the second reference impedance element 138 may be connected to one of the first signal source terminal 104 and second signal source terminal 106.

The terminals 128 and 130 may form an input port of the second branch 112 supplied by a signal generated by the signal source 102. The first and second branches 110 and 112 may therefore be in parallel with each other.

The second branch 112 is settable according to at least two different modes (configurations): a first mode, such that the second branch 112 is connected to the signal source 102 according to a first polarity (or direction); and a second mode, such that the second branch 112 is connected to the signal source 102 according to a second, different polarity (e.g., an inverted polarity), while the first branch does not change polarity.

For example: in the first mode, the first terminal 128 of the second branch 112 may be connected to the first signal source terminal 104 and the first terminal 114 of the first reference impedance element 118, while the second terminal 130 of the second branch 112 is connected to the second signal source terminal 106 and the second terminal 116 of the first sensor impedance element 122; and/or in the second mode, the first terminal 128 of the second branch 112 may be connected to the second signal source terminal 106 and the second terminal 116 of the first sensor impedance element 122, while the second terminal 130 of the second branch 112 is connected to the first signal source terminal 104 and the first terminal 114 of the first reference impedance element 118.

A schematization of the sensor of FIG. 1b is provided in FIG. 1c, where the connections of the signal source terminals 104 and 106 are connected with the first and second branches 110 and 112 of the bridge circuit 108.

An output port of the bridge circuit 108 may be formed by: a first intermediate terminal 126, intermediate between the first reference impedance element 118 and the first sensor impedance element 122; and a second intermediate terminal 144, intermediate between the second sensor impedance element 132 and the second reference impedance element 138.

Therefore, a signal (e.g., a differential signal) may be transmitted to another component.

Selection elements may be provided to perform the selection between the first and the second mode. Switches 160, 162, 164, 166 (represented as multiway switches) may be used to invert the polarity of the second branch 112 of the bridge circuit 108.

For example, the switch 160 may have: a first status which in the first mode connects the first signal source terminal 104 to the segment 170; a second status which in the second mode connects the first terminal 104 of the first branch 110 to the line 176.

The switch 162 may have: a first status which in the first mode connects the first terminal 128 of the second branch 112 to the segment 170; a second status which in the second mode connects the first terminal 128 of the second branch 112 to the line 174.

The switch 164 may have: a first status which in the first mode connects the second signal source terminal 106 to the segment 178; a second status which in the second mode connects the second signal source terminal 106 to the line 174.

The switch 166 may have: a first status which in the first mode connects the second terminal 130 of the second branch 112 to the segment 178; a second status which in the second mode connects the second terminal 130 of the second branch 112 to the line 176.

The switches 160, 162, 164, 166 may be controlled by a selector 152, which may simultaneously switch the switches 160, 162, 164, 166 between the first and the second mode.

The selection is represented by arrows in FIG. 1c and, in FIGS. 1a and 1b, by the line 153, which controls the status of the switches 160, 162, 164, 166. The selector 152 may be represented as an encoder which encodes a binary value for selecting between the first mode (154) and the second mode (156).

Circuitry (indicated, in FIGS. 1a and 1b, as the circuit 146) may obtain a first signal 149 from the first intermediate terminal 126 and a second signals 150 from the second intermediate terminal 144. The signals 149 and 150 may therefore form a differential signal. A measurement (here indicated with 148) or another value (e.g., a digital value) associated to the sensed pressure may therefore be output. In particular the measurement 148 may be obtained as a differential value of the first and second signals 149 and 150. For example, if the first and second signals 149 and 150 are voltage signals, the measurement 148 may be a digital value obtained by comparing the signal 149 with the signal iso. The circuit 146 may comprise, for example, a differential amplifier for amplifying the differential value and/or a digital-to-analog converter for converting the analog differential value into a digital value. In other cases, the measured value 148 may be an analog signal. In some examples (not shown in FIG. 2), the circuit 146 may have information of the selected mode: for example, the circuit 146 may be input by the line 153 (not shown), so as to be aware of the selected mode.

The first and second reference impedance elements 118 and 138 have electric parameters (e.g., impedances, capacitances, resistances . . . ) which are independent from the pressure. The first and second sensor impedance elements 122 and 132 are transducers that modify their electric parameters on the basis of a sensed pressure. Therefore, the signals (or differential signal) 149 and 150 may permit to obtain a precise measurement of the pressure.

Where the impedance capacitances elements are capacitors, in the first mode the measured signal may be of the type:

$$\text{signal}_{mode\ 1} = K(C_{R1} + C_{R2} - C_{S1} - C_{S2} + C_{OFFSET})$$

Capacitances $C_{R1}$ and $C_{R2}$ are known a priori, K is a known positive value dependent on the amplifier gain and decimation length, $C_{OFFSET}$ is known value dependent an amplifier offset setting (and can be negative). Each of $C_{S1}$ and $C_{S2}$ is function of the pressure. Therefore, from the value of the differential signal $\text{signal}_{mode\ 1}$ it is possible to obtain a signal 148 which is associated to the pressure.

In the second mode the differential signal may be of the type:

$$\text{signal}_{mode\ 2} = K(C_{R1} - C_{R2} + C_{S1} - C_{S2})$$

It has been noted that, even if the reference capacitors are manufactured as identical (and therefore at least theoretically $C_{R1} = C_{R2}$) and the sensor capacitors are manufactured as identical (and therefore at least theoretically $C_{S1} = C_{S2}$ if they sense the same pressure), the resulting value of $\text{signal}_{mode\ 2}$ is in general different from zero. Apparently, this error is due to the manufacturing tolerances which are different from each other for pressure-dependent capacitors. (As discussed below, however, in some examples the capacitors or impedances are intentionally different.)

Figure 1D:
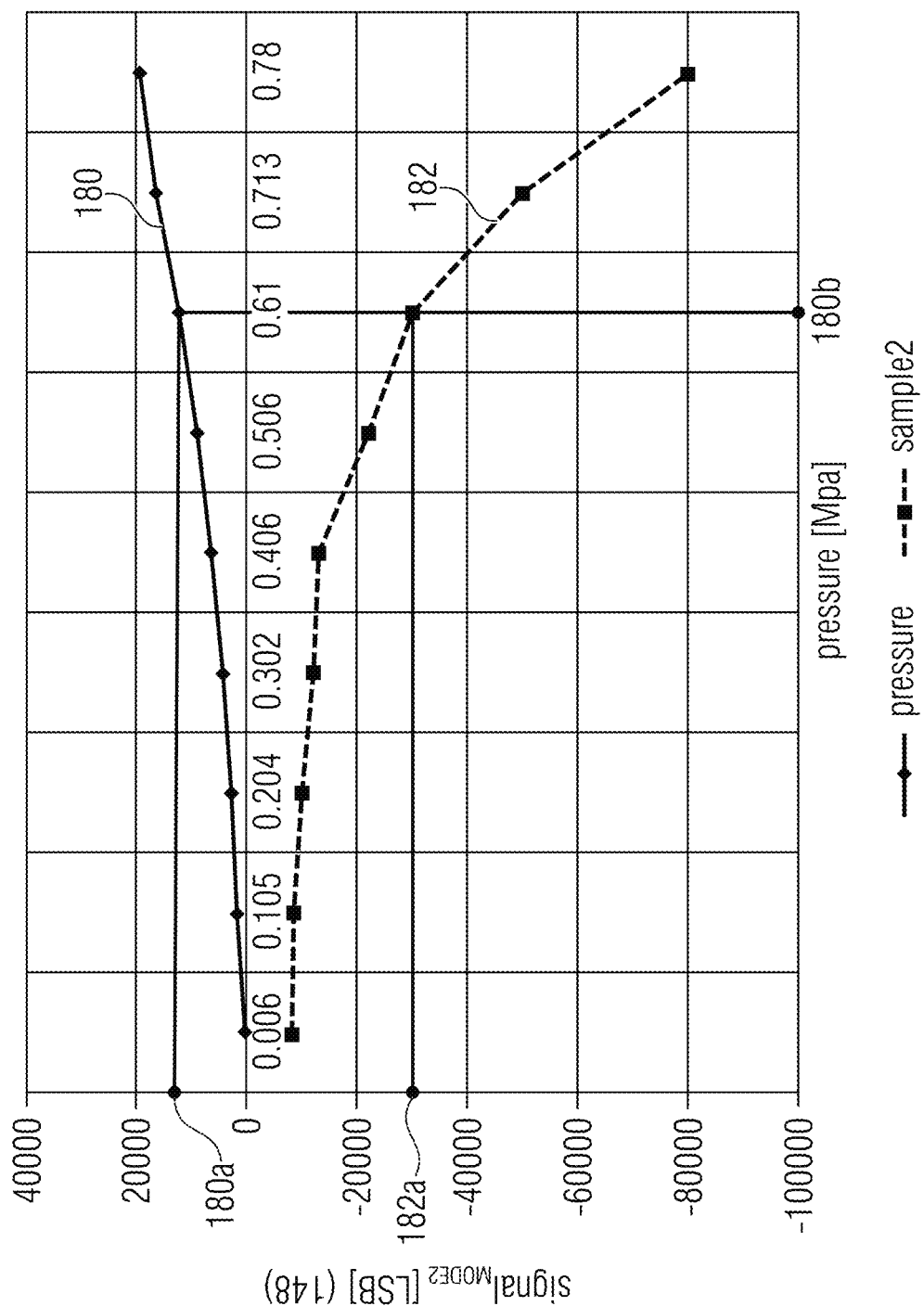
FIG. 1d shows a diagram regarding sensors.

It has been noted experimentally that the differential signal $\text{signal}_{mode\ 2}$ is dependent on the pressure. FIG. 1d shows experimental measurements 18o and 182 of two different sensors (abscissa: pressure; ordinate: the digital representation of $\text{signal}_{mode\ 2}$ or the value 148 output by the circuit 146). It may be seen that it is possible to measure the pressure even in the second mode.

It has been noted that in the second mode the measurement range is greater than in the first mode, even if the first mode permits to obtain a more precise and sensitive measurement. Hence, it is possible to perform a selection between the first mode when the pressure is in one specific, reduced range, and a second mode when the pressure is in a broader range.

It has been noted, however, that the first mode and the second mode permit to perform two different types of measurements: in the first mode, the sensitivity is higher, but the measurement range is more limited; in the second mode, the sensitivity is lower, but the measurement range is increased.

In the first mode, the capacitances are algebraically summed to each other, so as to provide a wide range of capacitance values which transduce pressures. A change of pressure implies a change in the sum $C_{S1} + C_{S2}$, which is a large value, implying an increased accuracy. In the second mode, the capacitances are subtracted with each other, hence decreasing the sensitivity but increasing the range of combinations. A change of pressure implies a change in the difference $C_{S1} - C_{S2}$, which is a small value, implying a low accuracy. These considerations also apply also for other type of bridge elements, such as e.g. resistors.

Figure 2:
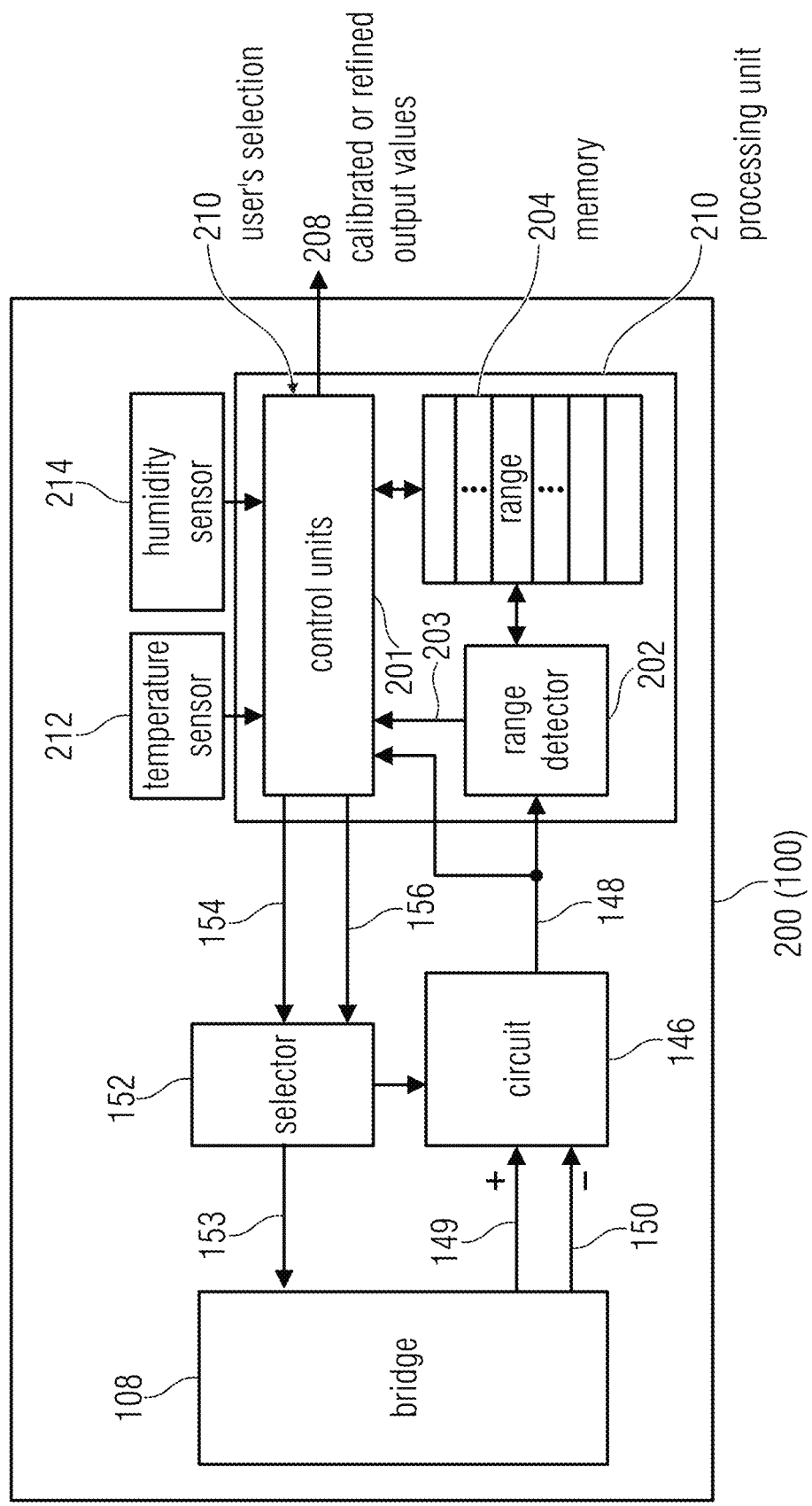
FIG. 2 shows an example of sensor.

FIG. 2 shows an example of environmental sensor (here indicated with 200) which may contain the sensor 100. In FIG. 2, however, some additional functions are:

The environmental sensor 200 may comprise a processing unit 210 which provides a pressure measurement 208 on the basis of the measurement or other value 148 provided by the bridge circuit 108. The processing unit 210 may control the bridge circuit 108 by controlling the selector 152 (e.g., by selecting the first mode 154 or second mode 156). In examples, the processing unit 210 may control the bridge circuit 108 on the basis of a feedback obtained from the bridge circuit 108. For example, signals 149, 150 and/or 148 may be part a feedback which permits to choose the most appropriated configuration (mode) for the bridge circuit. In examples, the measurement or other value 148 may provide a first value (which may be a rough value) of the pressure measurement. If the measurement or other value 148, for example, falls within the normal pressure range, the processing unit 210 will select the first mode, to achieve high sensitivity. If the measurement or other value 148 falls out of the normal pressure range (e.g., an out of scale value is provided), the processing unit 210 will select the second mode, to have a measurement on a broader range.

The environmental sensor 200 may comprise a range detector 202 which may be input from the measurement or other value 148, for example. The range detector 202 may perform a determination regarding the range of the measurement 148, whose result is here indicated with 203.

The environmental sensor 200 may comprise a control unit 201 which may provide a refined value 208 of the pressure measurement 148. The control unit 201 may obtain the result 203 of the determination of the range of the pressure and/or the pressure measurement 148. The control unit 201 may be the element which actively controls the bridge circuit 108, e.g., by controlling the line 153 (and the switches 160-166), e.g., via the selector 152 or in some other way. Information such as 148 and 203 may be understood as part of the feedback which permits to choose the most appropriated configuration (mode) for the bridge circuit.

In some examples, the control unit 201 may control the bridge circuit 108 on the basis of an input from a user's selection 210, for example. The control unit 201 may be input, for example, by data, measurement, information, etc., obtained from a temperature sensor 212 and/or a humidity sensor 214. Accordingly, the control unit 201 may control the circuit bridge 108 also on the basis of such information. For example, if the humidity sensor indicates that the sensor 200 is immersed in water, the pressure range may be changed and the bridge may be reconfigured to a mode which permits to measure pressure in liquid.

In examples, the processing unit 210 (and in particular the range detector 202 and/or the control unit 201) may make use of a memory 204 for determining the refined output value 208 and/or for controlling the bridge circuit 108. The memory 204 may be, for example, a read-only memory, ROM, a flash memory, a non-transitory memory, or another kind of memory. The memory 204 may comprise memory locations in which store refined pressure values or ranges in association to rough values 148, for example.

For example, the range detector 202, reading the value 148, may retrieve in the memory 204 a range within which the value 148 falls. Accordingly, the range detector 202 may determine the appropriated range for the measurement of the pressure.

In addition or alternative, the control unit 201 may use the values stored in the memory 204 to refine the pressure measurement 148 obtained by the circuit 146.

As shown in FIG. 1d, in fact, different sensors do not necessarily output the same value even if they have been manufactured as identical components. Therefore, it has been understood that it is possible to refine the measurement 148 by correcting it with data (e.g., stored in the memory 204) uniquely associated to the environmental sensor 200. Therefore, the range detector 202 and/or the control circuit 201 may perform their determinations and/or controls by relying on data in the memory 204, so as to refine the measurements and/or to perform a more precise control of the bridge circuit 108.

The data in the memory 204 may be "factory data", which are performed as steps of the manufacturing process. The factory data may comprise, for example, associations between the rough values 148 and the real pressure values and/or pressure ranges.

Reference may be made to FIG. 1d, for example. Rough measurements 148 may be performed by different sensors which measure the same pressure 180b (e.g., 0.61). For example a first sensor 200 may (associated to the experimental measurements 180) may obtain the value 180a as rough measurement 148. A second, different sensor 200 may (associated to the experimental measurements 182) may obtain the value 182a. However, the factory data stored in the memory 204 permit to reconvert the different rough measurements 180a and 182a into the correct pressure value 0.61 (180b). Basically, the memory 204 may store a lookup table which converts the values in the ordinate of FIG. 1d into the real measured values of the abscissa of FIG. 1d.

The memory 204 may be understood as storing calibration data which are used to refine the measurements 148 so that they are output as calibrated (refined) values.

In some examples, the memory 204 may operate as a lookup table, which is read by the range detector 202 and/or the control unit 201 to associate the rough measurement 148 to the refined or calibrated measurement 208.

In some cases, the value of the rough measurement 148 may be calibrated by using calibration coefficients stored in the memory 204. In this case, the refinement may be obtained by multiplying and/or subtracting the rough measurement value 148 by coefficients calculated during the manufacturing process. The coefficients may be obtained, for example, with the method of Least Means Squares (LMS), for example.

Figure 3A:
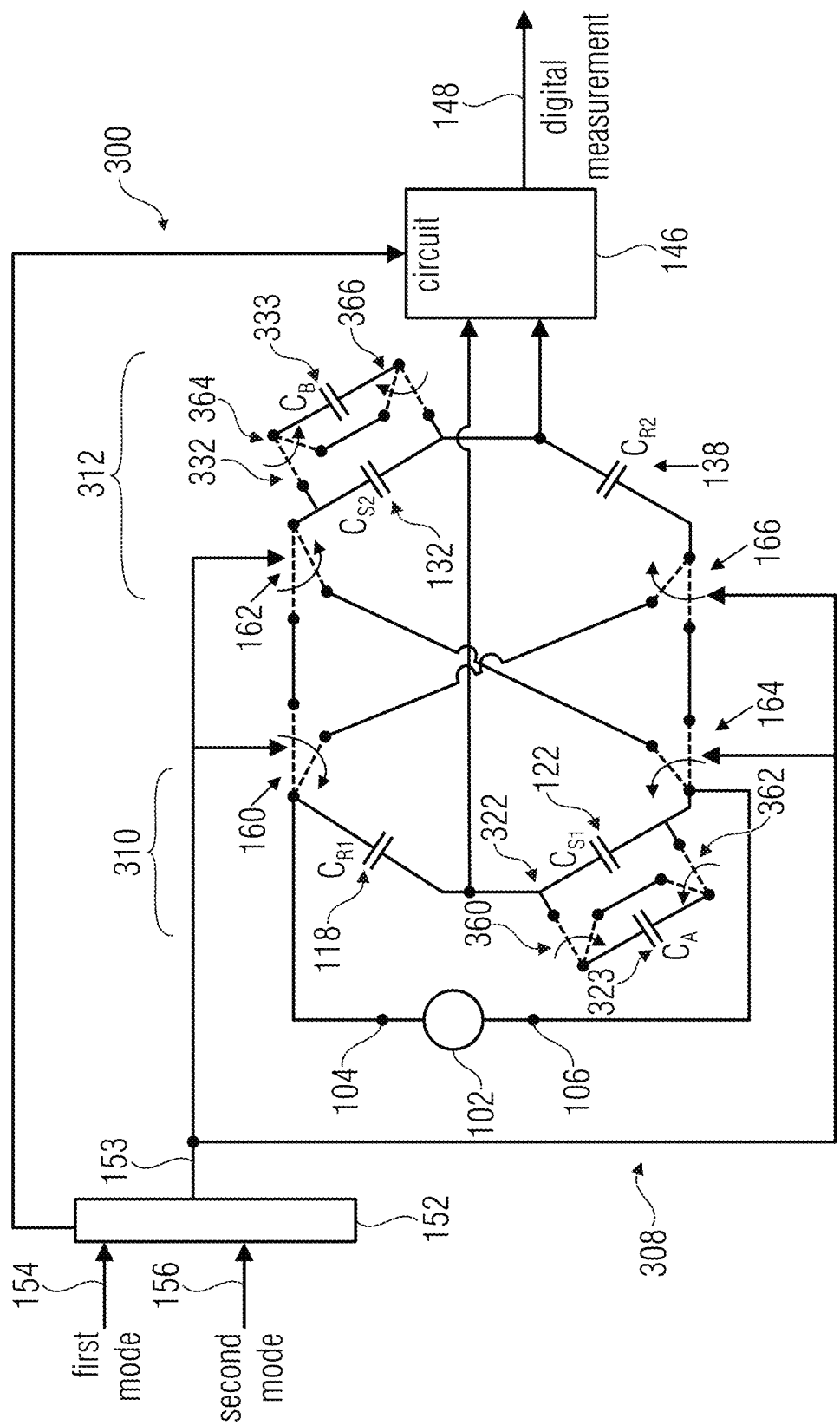
FIG. 3a shows an example of sensor.

FIG. 3a shows a variant, referred to with "300", of the environmental sensor 100 (reference numerals being the same as in FIGS. 1a-1c where possible or starting with numeral "3"). The environmental sensor 300 may comprise selection elements (such as the selector 152 and/or the switches 160-166) and a circuit 146 for obtaining a measurement 148 (e.g., a digital measurement, which may be a rough measurement to be refined or calibrated).

The environmental sensor 300 may comprise a bridge circuit 308 which may be analogous to the bridge circuit 108 (apart from some modifications which are described below). The first branch 310 and the second branch 312 may operate as the braces 110 and 112 of FIGS. 1a-1c (the second branch 312 being settable between a first configuration and a second configuration in which it has an inverted polarity as compared to the first configuration). The first branch 310 may comprise a first reference capacitance element 118 (which may be the same of the first reference capacitance element 118 of FIGS. 1b and 1c) in series with a first sensor capacitance element 322, configured to transduce a pressure value into a capacitance value, for example. The second branch 312 may comprise a second reference capacitance element 138 (which may be the same of the second reference capacitance element 118 of FIGS. 1b and 1c) in series with a second sensor capacitance element 332, configured to transduce a pressure value into a capacitance value, for example.

The difference between the first and second sensor capacitance elements 322 and 332 and the first and second sensor capacitance elements of FIGS. 1b and 1c is that at least one of the first and second sensor capacitance elements 322 and 332 is configured so as to be switched between: a lower capacitance value $C_{S1}$ or $C_{S2}$, associated, respectively, to a non-selectable sensor capacitance element 112 or 122 with variable capacitance $C_{S1}$ or $C_{S2}$; and/or a higher capacitance value $C_{S1}+C_A$ or $C_{S2}+C_A$, obtained, for example, by connecting in parallel the capacitor 112 or 122, respectively, with a selectable capacitor 323, with variable capacitance $C_A$, or 333 with variable capacitance $C_B$, respectively.

In order to actuate the selection between the lower capacitance value $C_{S1}$ or $C_{S2}$ and the higher capacitance value $C_{S1}+C_A$ or $C_{S2}+C_A$, selection elements such as switches 360, 362, 364, 366 may be used. These selection elements may be controlled, for example, by the selector 152 and/or the processing unit 210. Accordingly, an asymmetry is intentionally defined.

In general terms, by using different capacitances, different un-symmetries are obtained, which may permit to operate with different pressure ranges. In general, increased asymmetry implies increased sensitivity (even if, at the same time, increased asymmetry implies a reduced the range). In examples, it is possible to define a first capacitor $C_A$, a second capacitor $C_B=2*C_A$, a third capacitor with capacitance $3*C_A$, etc., so as to create different un-symmetries and different ranges.

In the first mode (for measuring a narrow range with high accuracy), the selectable capacitors are deactivated (e.g., switches 360-366 open). In the second mode (for measuring an extended range with lower accuracy), the selectable capacitors are activated (e.g., switches 360-366 closed).

Figure 3B:
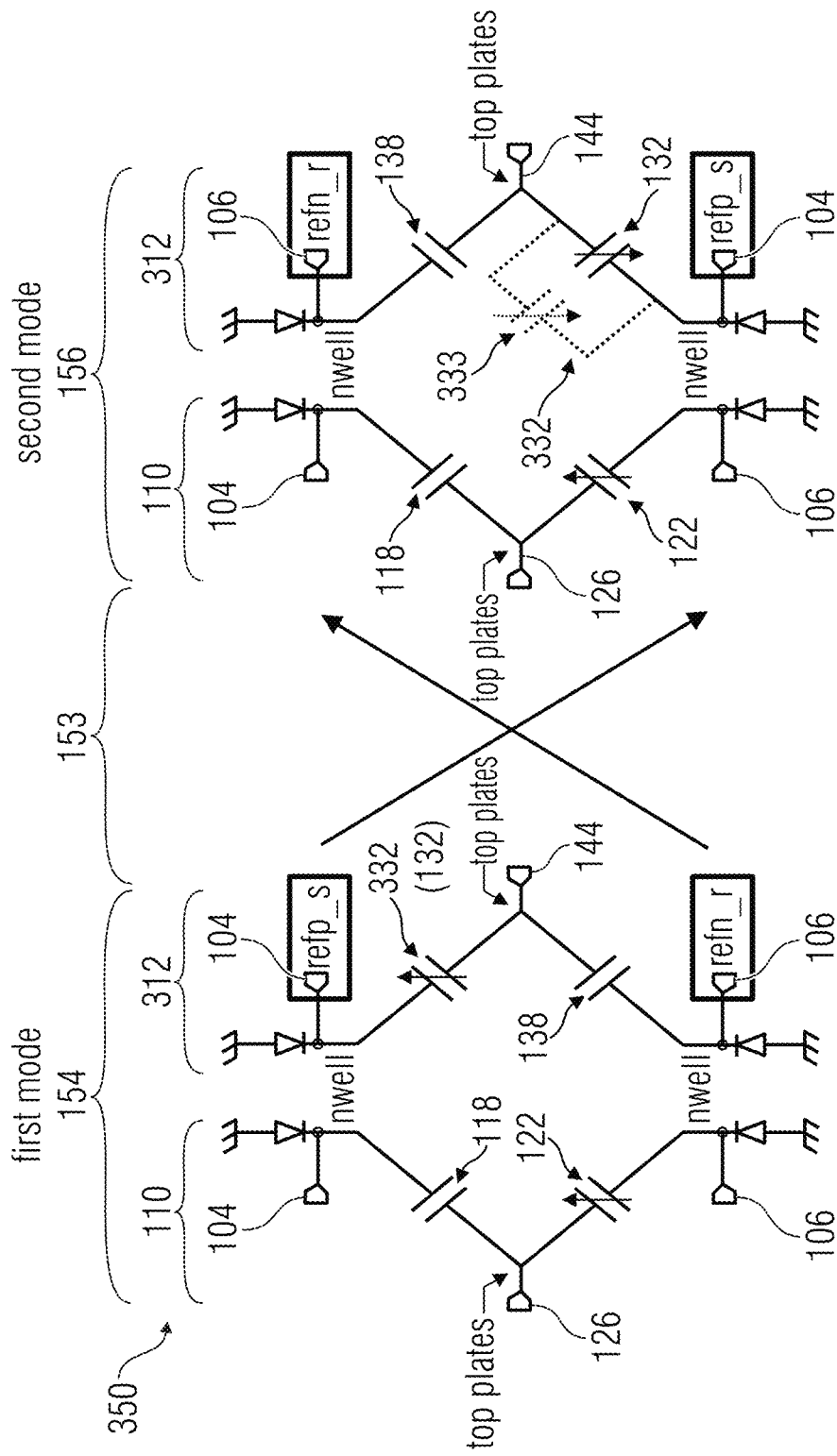
FIG. 3b shows a schema of a sensor.

FIG. 3b shows variants of the sensor 300 which is referred to with 350. This variant is analogous to that of FIG. 3a, apart from the fact that the selectable capacitor 323 is not present, while the selectable variable capacitor 333 is selectively connectable in parallel to the capacitor 132. Basically, while the first branch is here the same of the first branch 110 of FIGS. 1a-1c, the second branch is the same of the second branch 312 of FIG. 3a. In this variant, in the first mode 154 the selectable variable capacitor 333 is deactivated, while in the second mode 156 the selectable variable capacitor 333 is activated and connected in parallel to the capacitor 132. This architecture results in a systematic difference in the sensitivity in the second mode 156.

Notably, it is obtained the result of having the possibility of measuring, with acceptable accuracy and precision, two different ranges of pressures.

One single bridge circuit is used for different ranges. Therefore, space may be saved in the chip.

The sensors above and the sensor element (e.g., capacitances) may be micro electrical mechanical systems (MEMS), for example.

It has been understood that the examples above and below may be used for measuring pressures for different applications, such as: tire pressures (2-4 bar, in particular around 3 bar); and/or barometric pressures (e.g., 0.3-1.2 bar, such as 1 bar); and diving watches, smart watches (e.g., 8-10 bar).

Therefore, in examples, the sensors above may be embodied, for example, by tire pressure sensors, barometric pressure sensors, diving watches sensor, etc.

The examples above may also be generalized. The environmental sensor 100, 200, 300, 350 may be seen as a sensor comprising a circuitry (e.g., 146) configured to provide a measured value (e.g., 148, 208) of a pressure according to: a normal pressure range; and an extended pressure range, the environmental sensor further comprising selection elements (152, 160, 162, 164, 166) configured to switch between: a first mode (e.g., 154) for acquiring the measured value (e.g., 148, 208) in the normal pressure range; and a second mode (e.g., 156) for acquiring the measured value (e.g., 148, 208) in the extended pressure range.

Figure 4:
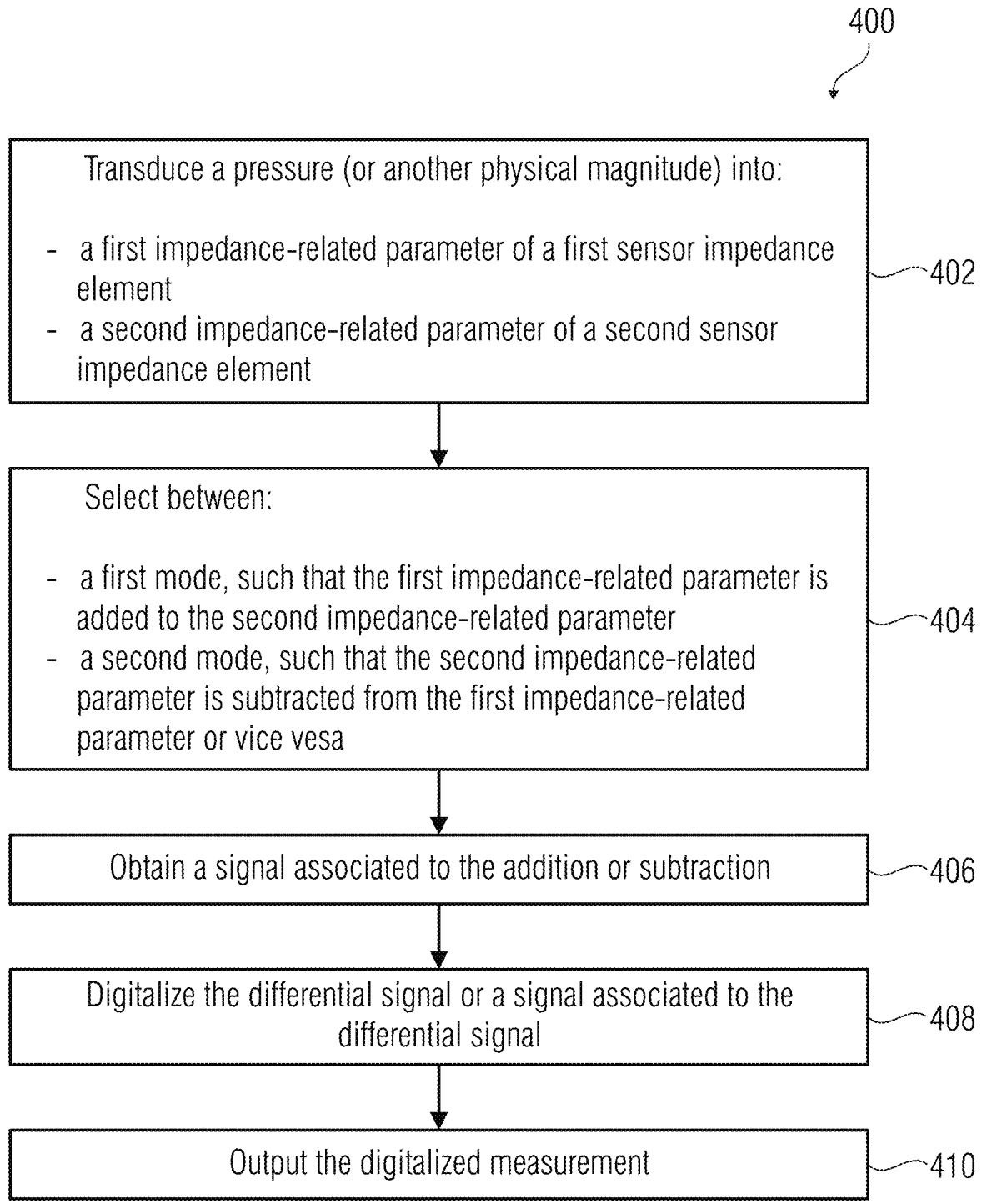
FIGS. 4-7 show examples of methods.

FIG. 4 shows a method 400 for measuring a pressure, e.g., using one of the sensors above. The method may comprise a step 402 of transducing a pressure into: a first impedance-related parameter (e.g., $Z_{S1}$, $C_{S1}$) of a first sensor impedance element (e.g., 122); and a second impedance-related parameter (e.g., $Z_{S2}$, $C_{S2}$) of a second sensor impedance element (e.g., 132).

The method may comprise a step 404 of selecting (e.g. by the selector 152 and/or by the control unit 201) between: a first mode (e.g., 154), such that the first impedance-related parameter (e.g., $Z_{S1}$, CO is added to the second impedance-related parameter (e.g., $Z_{S2}$, $C_{S2}$); and a second mode (e.g., 156), such that the second impedance-related parameter (e.g., $Z_{S2}$, $C_{S2}$) is subtracted from the first impedance-related parameter (e.g., $Z_{S1}$, $C_{S1}$) or vice versa.

The method may comprise a step 406 of obtaining a signal (e.g., the differential signal between signals 149 and iso) associated to the addition or subtraction. The method may comprise a step 408 of digitalizing (e.g., by circuit 146) the differential signal or a signal associated to the differential signal. The method may comprise a step 410 of outputting the digitalized measurement (e.g., the measurement 148 or the refined measurement 208).

Figure 5:
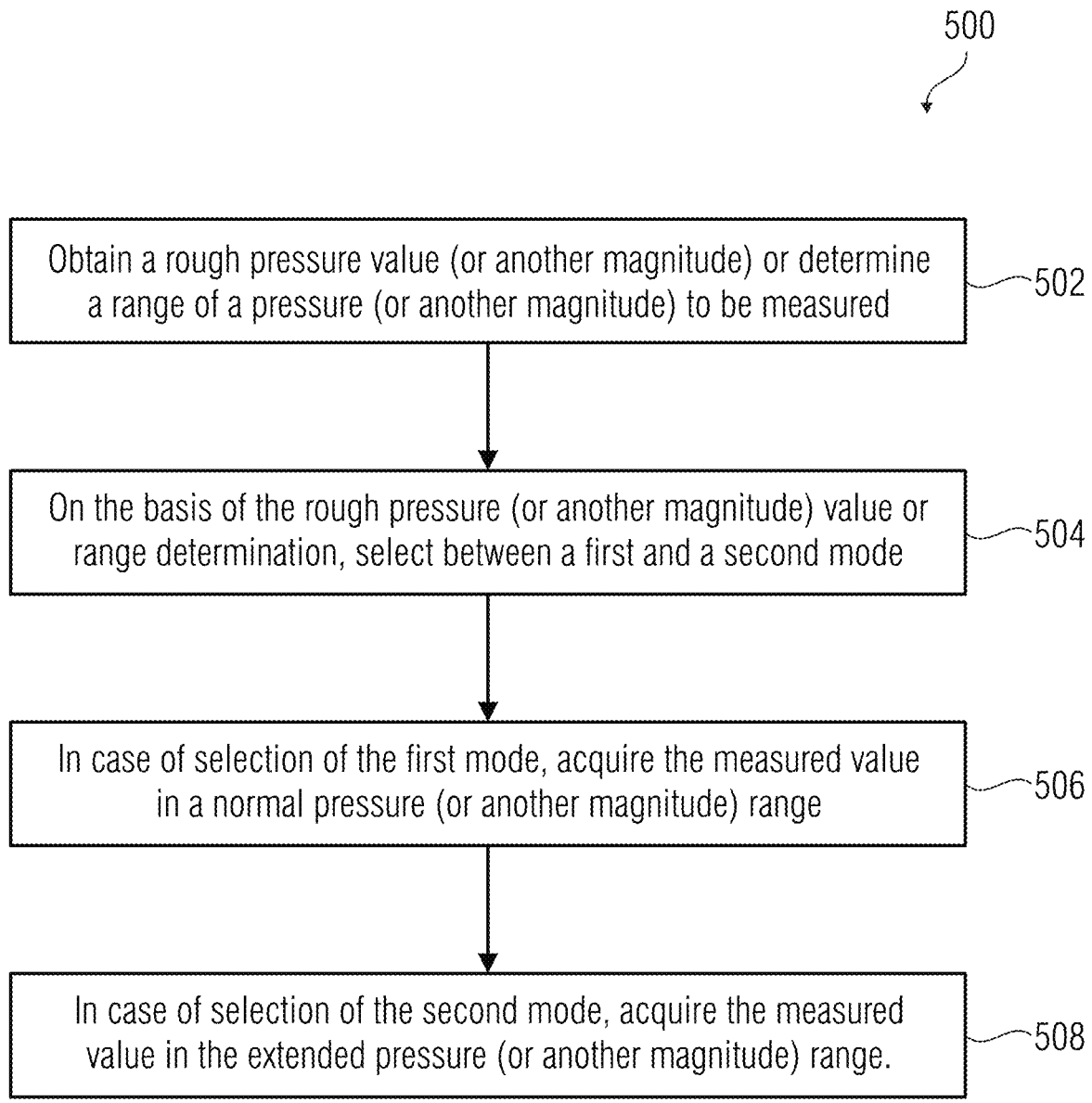

FIG. 5 shows a method 500 for measuring a pressure, which may be performed, for example, by one of the environmental sensors above. The method may comprise a step 502 of obtaining a rough pressure value or determining a range of a pressure to be measured. The method may comprise a step 504 of, on the basis of the rough pressure value or range determination, selecting between a first and a second mode. The method may comprise a step 506 of, in case of selection of the first mode, acquiring the measured value in a normal pressure range. The method may comprise a step 508 of, in case of selection of the second mode, acquiring the measured value in the extended pressure range.

Figure 6:
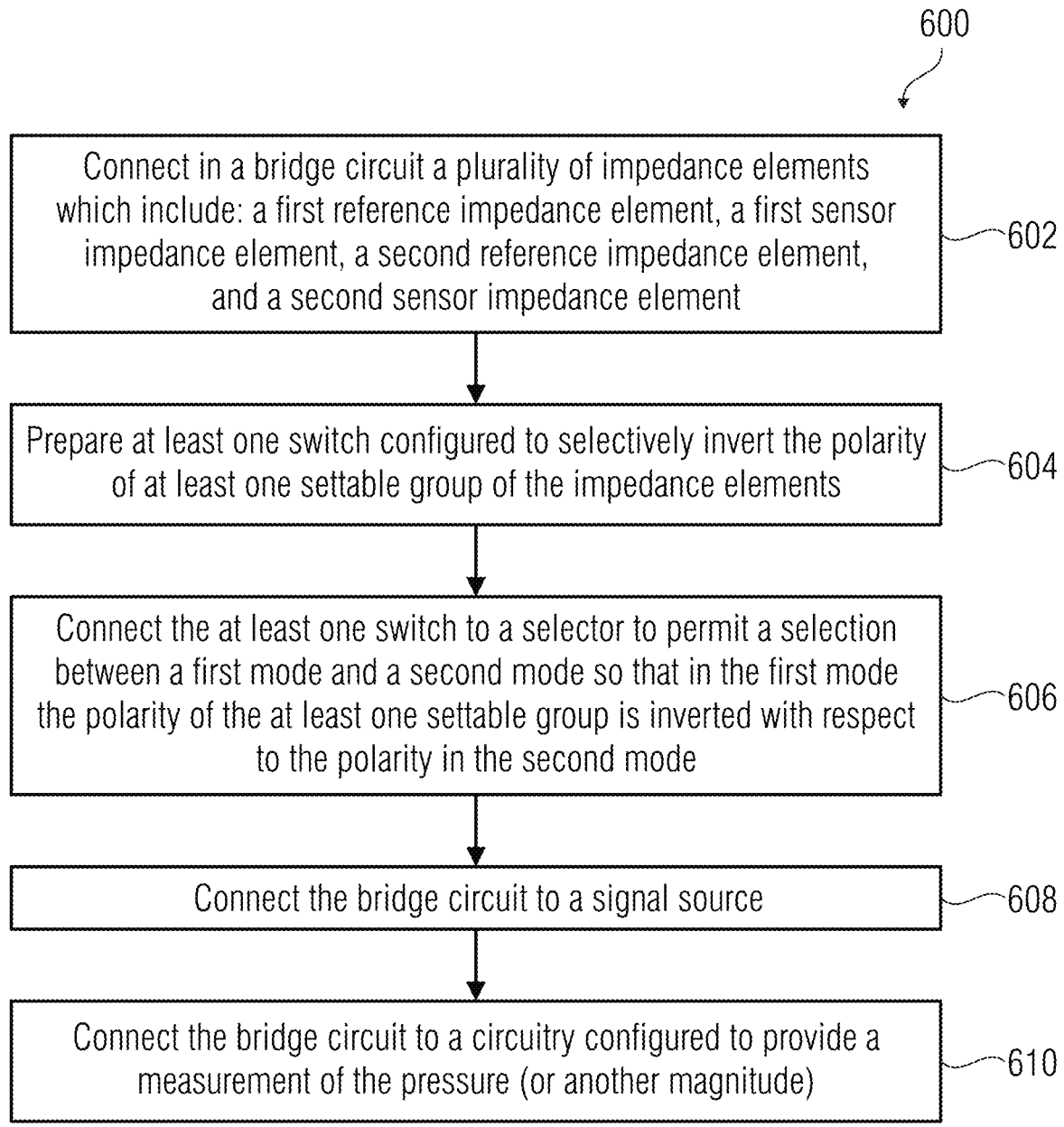

FIG. 6 shows a method 600 for manufacturing one of the sensors above. The method may comprise a step 602 of connecting in a bridge circuit (e.g., 108) a plurality of impedance elements (e.g., 118, 122, 138, 132) which include: a first reference impedance element (e.g., 118), a first sensor impedance element (e.g., 122), a second reference impedance element (e.g., 138), and a second sensor impedance element (e.g., 132). The method may comprise a step 604 of preparing at least one switch (e.g., 160-166) configured to selectively invert the polarity of at least one settable group (e.g., 112) of the impedance elements (e.g., 118, 122, 138, 132). The method may comprise a step 606 of connecting the at least one switch (e.g., 160-166) to a selector (e.g., 152) to permit a selection between a first mode (e.g., 154) and a second mode (e.g., 156) so that in the first mode (e.g., 154) the polarity of the at least one settable group (e.g., 112) is inverted with respect to the polarity in the second mode (e.g., 156). The method may comprise a step of connecting the bridge circuit (e.g., 108) to a signal source (e.g., 102). The method may comprise a step 610. The method may comprise a step of connecting the bridge circuit (e.g., 108) to a circuitry (e.g., 146) configured to provide a measurement (148) of the pressure.

Figure 7:
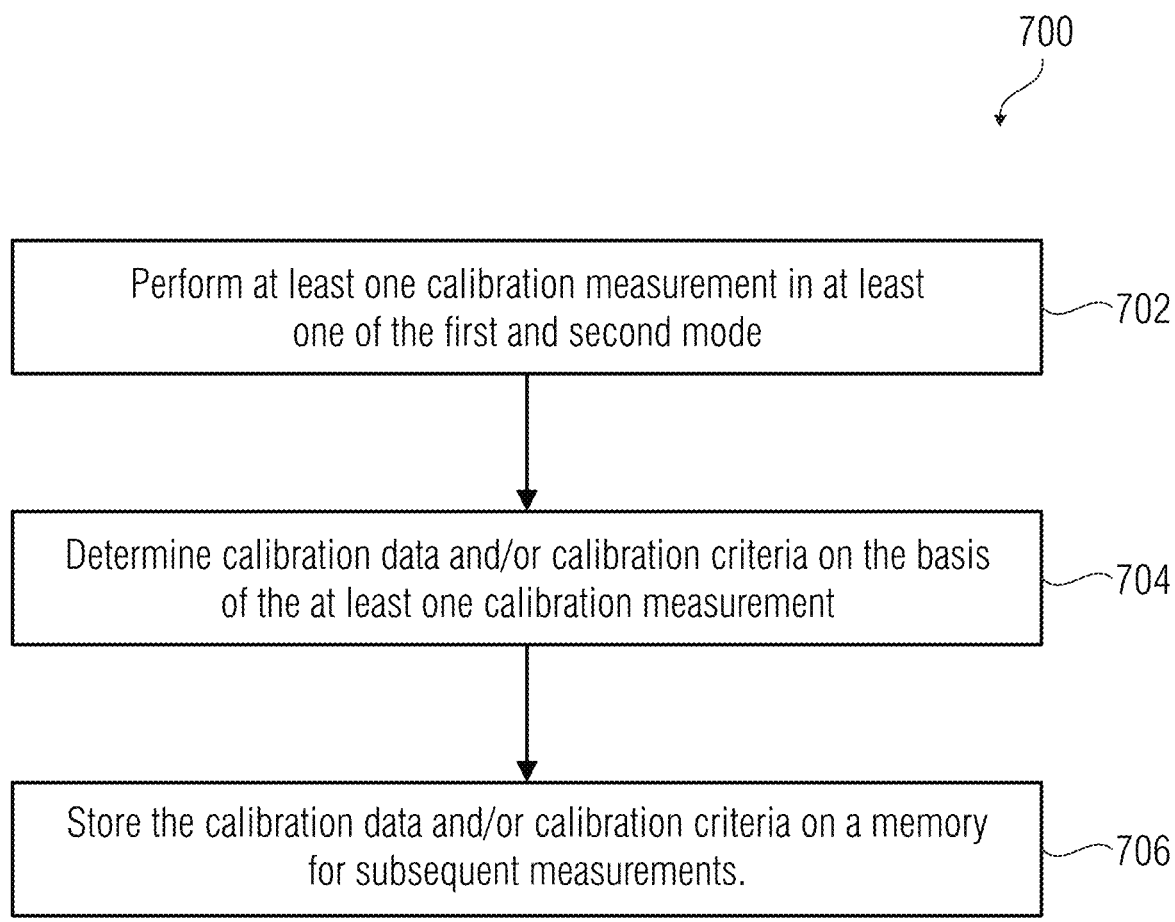

FIG. 7 shows a method 700 for calibrating one of the environmental sensors above. The method 700 may comprise a step 702 of performing at least one calibration measurement in at least one of the first and second mode. The method 700 may comprise a step 704 of determining calibration data and/or calibration criteria on the basis of the at least one calibration measurement. The method 700 may comprise a step 706 of storing the calibration data and/or calibration criteria on a memory for subsequent measurements.

In the examples above, reference has been principally made to environmental sensors and/or pressure sensors. However, the invention is not limited to environmental or pressure measurements. For example, many examples above may be implemented in any physical system which is suitable to modify the impedance or resistance on the basis of the value or magnitude which is to be measured.

Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitory, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

The above described examples are illustrative for the principles discussed above. It is understood that modifications and variations of the arrangements and the details described herein will be apparent. It is the intent, therefore, to be limited by the scope of the impending patent claims and not by the specific details presented by way of description and explanation of the examples herein.

What is claimed is:

1. A sensor comprising:
   selection elements configured to switch between:
     a first mode for acquiring a measured value in a normal range, and
     a second mode for acquiring the measured value in an extended range; and
   a control circuit configured to
     obtain a rough value or determine a range of a magnitude to be measured, and
     based on the rough value or the determined range, configuring the selection elements in the first mode and the second mode.

2. A sensor comprising:
   a signal source comprising a first signal source terminal and a second signal source terminal;
   a bridge circuit connected to the first and second signal source terminals, the bridge circuit including:
     a first branch comprising a first reference impedance element, and a first sensor impedance element configured to transduce a magnitude to be measured into a first impedance-related parameter;
     a second branch comprising a second reference impedance element, and a second sensor impedance element configured to transduce the magnitude to be measured into a second sensor impedance-related parameter;
     a first output terminal intermediate between the first reference impedance element and the first sensor impedance element;
     a second output terminal intermediate between the second reference impedance element and the second sensor impedance element;
     selection elements configured to switch between a first mode and a second mode, wherein in the second mode the second branch is inverted with respect to the first mode; and
     circuitry configured to provide a measured value based on a differential signal obtained between the first output terminal and the second output terminal.

3. The sensor of claim 2, wherein the first sensor impedance element and the second sensor impedance element comprise a MEMS sensor.

4. The sensor of claim 2, wherein:
   the sensor is configured as an environmental sensor;
   the sensor is configured to provide the measured value of the magnitude to be measured according to a normal range, and an extended range; and
   the selection elements are configured to switch between:
     the first mode for acquiring the measured value in the normal range; and
     the second mode for acquiring the measured value in the extended range.

5. The sensor of claim 2, wherein at least one of the first reference impedance element, the first sensor impedance element, the second reference impedance element, or the second sensor impedance element is a capacitance element.

6. The sensor of claim 2, wherein at least one of the first sensor impedance element or second sensor impedance element comprises:
   a fixed capacitance element; and
   a selectable capacitance element selectively connectable in parallel to the fixed capacitance element,
   wherein the selection elements are configured to connect the selectable capacitance element in parallel to the fixed capacitance element in the second mode.

7. The sensor of claim 2, wherein the sensor is further configured to receive a selection between the first mode and the second mode.

8. The sensor of claim 2, wherein the sensor is further configured:
   in the first mode:
     the first sensor impedance element and the second reference impedance element are connected to the same signal source terminal, or
     the second sensor impedance element and the first reference impedance element are connected to the same signal source terminal; or
   in the second mode:
     the first sensor impedance element and the second sensor impedance element are connected to the same signal source terminal, or
     the first reference impedance element and the second reference impedance element are connected to the same signal source terminal.

9. The sensor of claim 2, further comprising:
   a range detector configured to determine whether the measured value is within a normal range or outside of the normal range; and
   a control unit configured control the switching between the first and the second mode based on a determination carried out by the range detector whether the measured value is within the normal range or outside of the normal range.

10. The sensor of claim 2, further comprising:
a memory comprising data associated to the measured value,
wherein the sensor is configured to provide an output measured value associated with the measured value and the data associated with the measured value.

11. The sensor of claim 2, wherein the magnitude to be measured is a pressure.

12. An electronic device comprising one single chip including the sensor of claim 2.

13. A method for performing a measurement, comprising:
transducing a magnitude to be measured into:
   a first impedance-related parameter of a first sensor impedance element, and
   a second impedance-related parameter of a second sensor impedance element;
selecting between a first mode, such that the first impedance-related parameter is added to the second impedance-related parameter to provide a first signal, and a second mode, such that the second impedance-related parameter is subtracted from the first impedance-related parameter to provide the first signal or vice versa;
obtaining the first signal;
digitizing the first signal or a signal associated with the first signal to form a digitized measurement; and
outputting the digitized measurement.

14. The method of claim 13, wherein transducing the magnitude comprises using a bridge circuit comprising
   a first branch comprising a first reference impedance element, and the first sensor impedance element configured to transduce the magnitude to be measured into the first impedance-related parameter; and
   a second branch comprising a second reference impedance element, and the second sensor impedance element configured to transduce the magnitude to be measured into the second impedance-related parameter.

15. The method of claim 14, wherein the bridge circuit further comprises selection elements configured to invert the second branch with respect to the first branch in the second mode.

16. The method of claim 14, further comprising applying a reference voltage across the first branch and the second branch.

17. The method of claim 14, wherein the first signal comprises a voltage measured between a first common node and a second common node, wherein the first common node is coupled between the first reference impedance element and the first sensor impedance element, and the second common node is coupled between the first reference impedance element and the first sensor impedance element.

18. A method for performing a measurement, comprising:
obtaining a rough value or determining a range of a magnitude to be measured;
based on the rough value or the determining the range, selecting between a first and a second mode;
in case of selection of the first mode, acquiring a measured value in a normal range; and
in case of selection of the second mode, acquiring the measured value in an extended range.

19. A method for manufacturing a sensor comprising:
connecting in a bridge circuit a plurality of impedance elements which include: a first reference impedance element, a first sensor impedance element, a second reference impedance element, and a second sensor impedance element;
preparing at least one switch configured to selectively invert a polarity of at least one settable group of the impedance elements;
connecting the at least one switch to a selector to permit a selection between a first mode and a second mode so that in the first mode the polarity of the at least one settable group is inverted with respect to the polarity in the second mode;
connecting the bridge circuit to a signal source; and
connecting the bridge circuit to a circuitry configured to provide a measurement of a magnitude to be measured.

20. The method of claim 19, comprising a calibration session including:
performing at least one calibration measurement in at least one of the first and second mode;
determining calibration data and/or calibration criteria based on the at least one calibration measurement; and
storing the calibration data and/or calibration criteria on a memory for subsequent measurements.

* * * * *